United States Patent
Huang et al.

(10) Patent No.: US 6,593,223 B1
(45) Date of Patent: *Jul. 15, 2003

(54) METHOD OF FORMING DUAL DAMASCENE STRUCTURE

(75) Inventors: Yimin Huang, Taichung Hsien (TW); Tri-Rung Yew, Hsinchu Hsien (TW)

(73) Assignee: United Microelectronics Corporation, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 09/524,720

(22) Filed: Mar. 14, 2000

Related U.S. Application Data (63) Continuation of application No. 09/123,342, filed on Jul. 28, 1998, now Pat. No. 6,060,379.

(30) Foreign Application Priority Data

Jun. 1, 1998 (TW) .................................. 87108503 A (51) Int. Cl.⁷ .......................................... H01L 21/4763
(52) U.S. Cl. ..................... 438/618; 438/634; 438/636
(58) Field of Search ......................... 438/618, 651, 438/653, 634, 636

(56) References Cited

U.S. PATENT DOCUMENTS

| | | |
|---|---|---|
| 4,789,648 A | 12/1988 | Chow et al. |
| 5,047,367 A | 9/1991 | Wei et al. |
| 5,302,552 A | 4/1994 | Duchateau et al. |
| 5,344,793 A | 9/1994 | Zeininger et al. |
| 5,354,711 A | 10/1994 | Heitzmann et al. |
| 5,356,837 A | 10/1994 | Geiss et al. |
| 5,466,639 A | 11/1995 | Ireland |
| 5,536,684 A | 7/1996 | Dass et al. |
| 5,602,053 A | 2/1997 | Zheng et al. |
| 5,612,254 A | 3/1997 | Mu et al. |
| 5,614,765 A | 3/1997 | Avanzino et al. |
| 5,635,423 A | 6/1997 | Huang et al. |
| 5,702,982 A | 12/1997 | Lee et al. |
| 5,705,430 A | 1/1998 | Avanzino et al. |
| 5,736,457 A | 4/1998 | Zhao |
| 5,736,461 A | 4/1998 | Berti et al. |
| 5,744,376 A | 4/1998 | Chan et al. |
| 5,753,967 A | 5/1998 | Lin |
| 5,780,362 A | 7/1998 | Wang et al. |
| 5,801,094 A | 9/1998 | Yew et al. |
| 5,821,169 A | 10/1998 | Nguyen et al. |
| 5,904,564 A | 5/1999 | Park |
| 5,933,761 A | 8/1999 | Lee et al. |
| 5,970,370 A | 10/1999 | Besser et al. |
| 5,989,997 A | 11/1999 | Lin et al. |
| 5,990,015 A | 11/1999 | Lin et al. |
| 6,001,414 A | 12/1999 | Huang et al. |
| 6,001,735 A * | 12/1999 | Tsai ........................ 438/638 |
| 6,004,883 A | 12/1999 | Yu et al. |
| 6,017,817 A | 1/2000 | Chung et al. |
| 6,022,457 A | 2/2000 | Huang et al. |
| 6,025,259 A | 2/2000 | Yu et al. |

(List continued on next page.)

Primary Examiner—Matthew Smith
Assistant Examiner—Calvin Lee
(74) Attorney, Agent, or Firm—William J. Kubida; Jed W. Caven; Hogan & Hartson LLP (57) ABSTRACT

A method of forming a dual damascene structure comprises the steps of providing a substrate having a first conductive layer formed thereon, and then sequentially forming a first dielectric layer, an anti-reflection layer and a second dielectric layer over the substrate. Next, the first dielectric layer, the anti-reflection layer and the second dielectric layer are patterned to form a first opening that exposes the conductive layer. Thereafter, the second dielectric layer is patterned to form a trench (or second opening) in a position above the first conductive layer. The trench and the first opening together form an opening of the dual damascene structure. Finally, a second conductive material is deposited into the opening and the trench to form conductive lines and the dual damascene structures.

3 Claims, 8 Drawing Sheets

U.S. PATENT DOCUMENTS

| | | |
|---|---|---|
| 6,025,274 A | 2/2000 | Lin et al. |
| 6,027,994 A | 2/2000 | Huang et al. |
| 6,042,996 A | 3/2000 | Lin et al. |
| 6,042,999 A | 3/2000 | Lin et al. |
| 6,057,239 A | 5/2000 | Wang et al. |
| 6,063,711 A | 5/2000 | Chao et al. |
| 6,077,769 A | 6/2000 | Huang et al. |
| 6,083,817 A | 7/2000 | Nogami et al. |
| 6,100,191 A | 8/2000 | Lin et al. |
| 6,121,123 A * | 9/2000 | Lyons et al. .............. 438/585 |
| 6,486,059 B2 * | 11/2002 | Lee et al. ................. 438/637 |

* cited by examiner

METHOD OF FORMING DUAL DAMASCENE STRUCTURE

CROSS-REFERENCE TO RELATED APPLICATION

The present application is a continuation of U.S. patent application Ser. No. 09/123,342, filed Jul. 28, 1998, now U.S. Pat. No. 6,060,379, which claims priority from Taiwan Application No. 87108503, filed Jun. 1, 1998, all the disclosures of which are herein specifically incorporated by this reference.

BACKGROUND OF THE INVENTION

1. Field of Invention

The present invention relates to a method of forming multilevel interconnects that are used to interconnect semiconductor devices. More particularly, the present invention relates to a method of forming a dual damascene structure.

2. Description of Related Art

Dual damascene structure is an ingenious design that forms embedded metallic interconnects within an insulating layer. The method of forming a dual damascene structure includes first forming an insulating layer over a substrate, and then planarizing the insulating layer. Thereafter, according to the required metallic line pattern and positions of via holes, the insulating layer is etched to form horizontal trenches and vertical vias. Next, metal is deposited over the substrate to fill the horizontal trenches and the vertical vias, thereby simultaneously forming metallic lines and vias.

Finally, a chemical-mechanical polishing (CMP) method is used to planarize the device surface. Unlike conventional processes, which first forms vias and then forms metallic lines in a photolithographic method, the present invention forms vias and metallic lines in a single operation. Hence, overlay errors or process bias due to mask misalignment can be avoided, and reliability of devices can be improved. Consequently, as the level of integration of devices increases, dual damascene structure is widely adopted in the semiconductor industry.

Figure 1A:
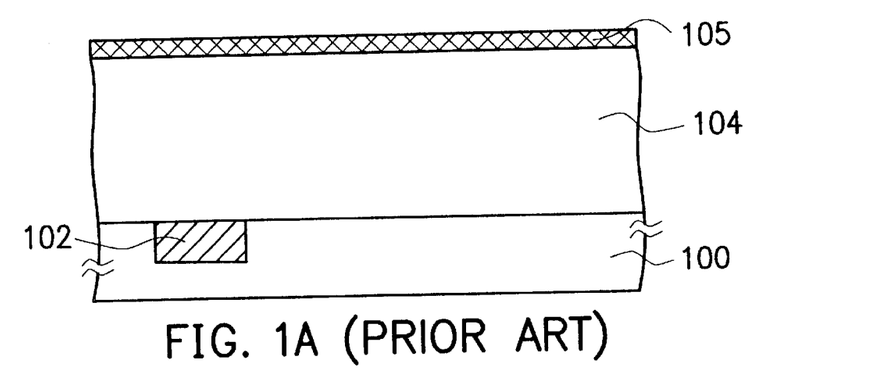
FIG. 1A through 1E are cross-sectional views showing the progression of manufacturing steps in fabricating a dual damascene structure according to a conventional method.

FIG. 1A through 1E are cross-sectional views showing the progression of manufacturing steps in fabricating a dual damascene structure according to a conventional method. First, as shown in FIG. 1A, a substrate 100 having a metallic layer 102 thereon is provided. Next, an inter-metal dielectric (IMD) 104 is formed over the substrate and the metallic layer 102, and then the IMD layer 104 is planarized. The inter-metal dielectric layer 104 can be a silicon oxide layer formed by a chemical vapor deposition method, and the IMD layer 104 can be planarized using a chemical-mechanical polishing method, for example. To prevent reflection from the metallic layer 102 in subsequent photolithographic operations which reflection may affect its resolution, an anti-reflection layer 105 is also formed over the IMD layer 104.

Figure 1B:
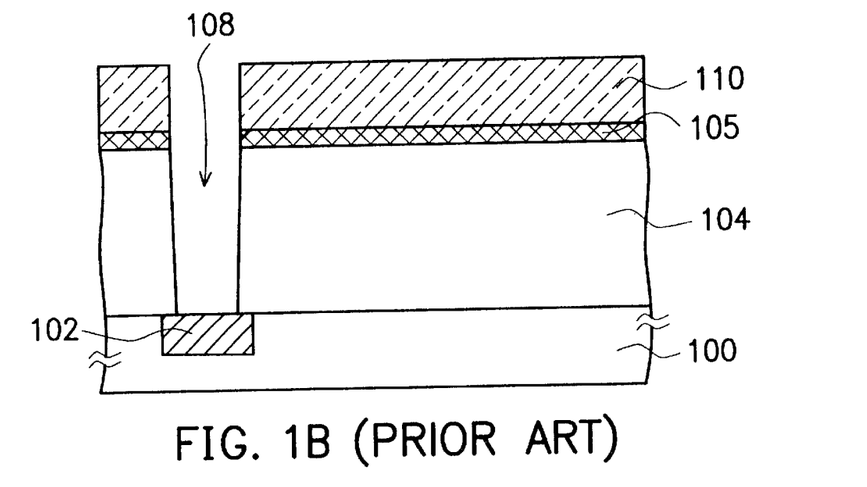

Next, as shown in FIG. 1B, the anti-reflection layer 105 and the inter-metal dielectric layer 104 are patterned to form an opening 108 that exposes the metallic layer 102. Typically, the method includes depositing photoresist over the anti-reflection layer 105, and then patterning to form an opening in the photoresist layer 110. Next, using the patterned photoresist layer 110 as a mask, the anti-reflection layer 105 and the IMD layer 104 are etched to form the opening 108. Finally, the photoresist layer 110 is removed.

Figure 1C:
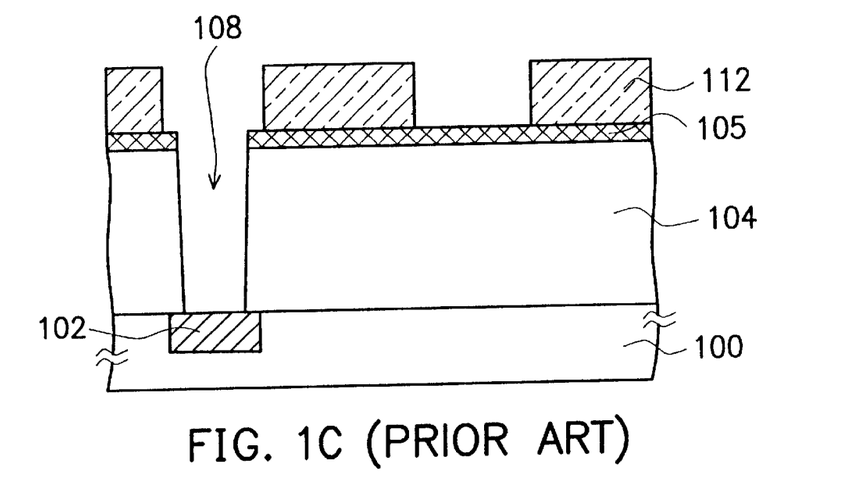
Figure 1D:
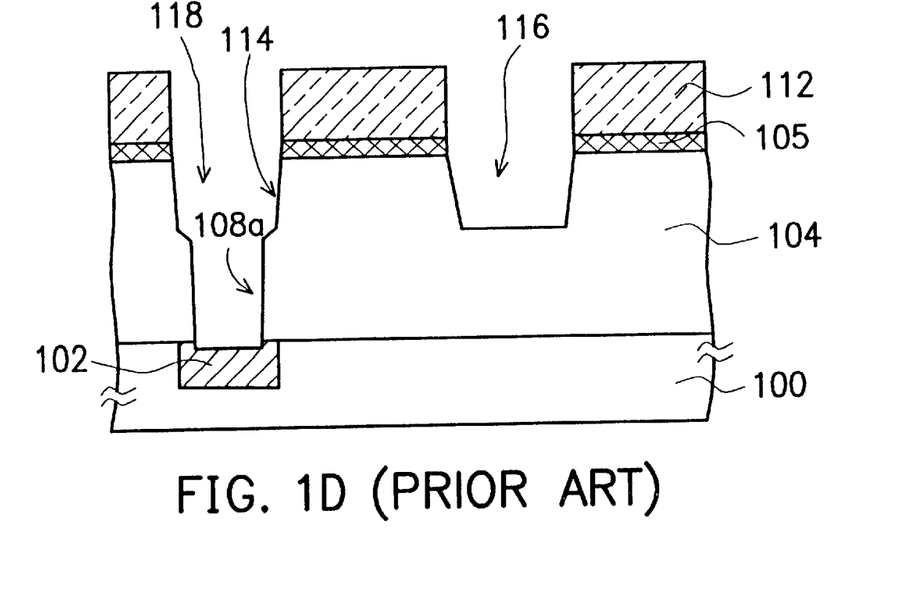

Thereafter, as shown in FIGS. 1C and 1D, the anti-reflection layer 105 and the IMD layer 104 are patterned again to form trenches 114 and 116. Trench 114 is formed in a position above the metallic layer 102, and trench 114 together with the residual opening 108a that leads to the metallic layer 102 form an opening 118 of the dual damascene structure. Generally, the method of forming the trenches includes depositing photoresist over the IMD layer 104, and then patterning to form an opening in the photoresist layer 112 as shown in FIG. 1C. Next, using the patterned photoresist layer 112 as a mask, the anti-reflection layer 105 and the IMD layer 104 are etched to form trenches 114 and 116 as shown in FIG. 1D. Finally, the photoresist layer 112 is removed.

Figure 1E:
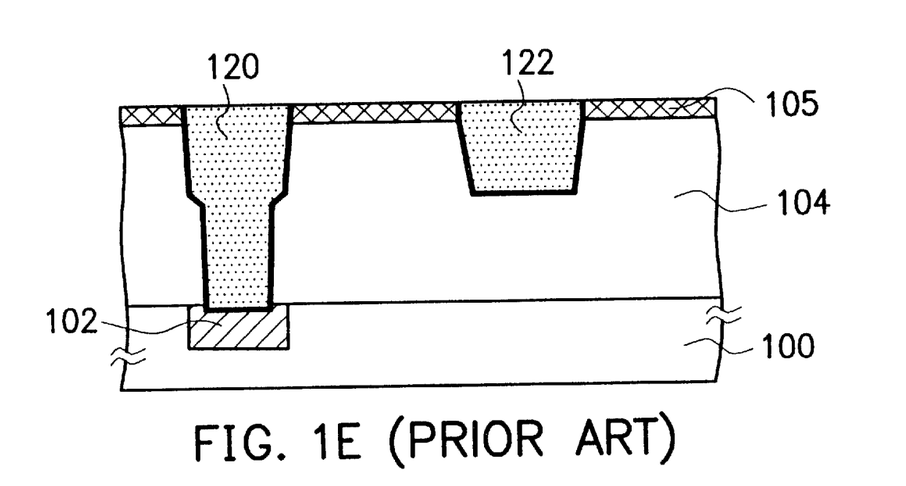

Subsequently, as shown in FIG. 1E, conductive material is deposited over the substrate 100 to fill the opening 118 and the trench 116. Thereafter, the conductive layer is planarized to form a dual damascene structure 120 and a metallic line 122. Conventionally, the conductive material can be aluminum or tungsten with a titanium/titanium nitride composite layer underneath serving as barrier layer/glue layer. However, in the operations as described in FIGS. 1A through 1E, there is no etching stop layer when the IMD layer 104 is etched to form the trenches 114 and 116. Consequently, depth of trenches 114 and 116 is difficult to control, and hence ultimate electrical properties of devices can vary considerably.

Figure 2A:
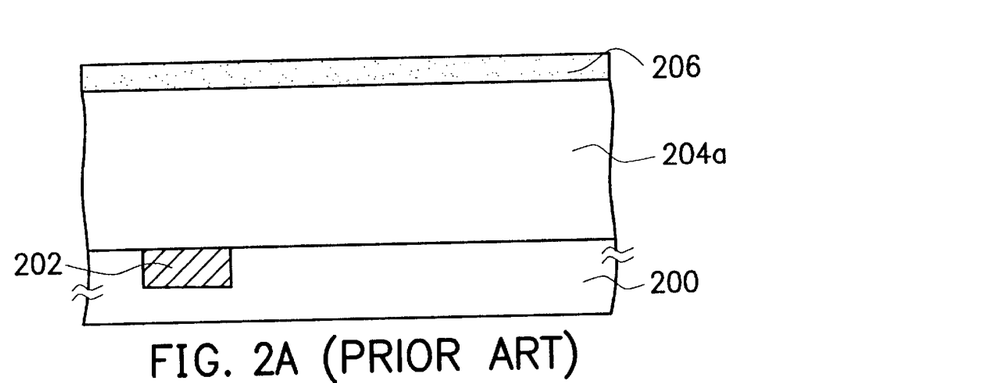
FIGS. 2A through 2E are cross-sectional views showing the progression of manufacturing steps in fabricating a dual damascene structure according to an alternative method.

FIGS. 2A through 2E are cross-sectional views showing the progression of manufacturing steps in fabricating a dual damascene structure according to an alternative method. First, as shown in FIG. 2A, a substrate 200 having a first metallic layer 202 thereon is provided. Next, a dielectric layer 204a is formed over the substrate 200, and then the dielectric layer 204a is planarized so that its thickness matches the depth of a via hole. Thereafter, a silicon nitride layer 206 that serves as an etching stop layer is formed over the dielectric layer 204a.

Figure 2B:
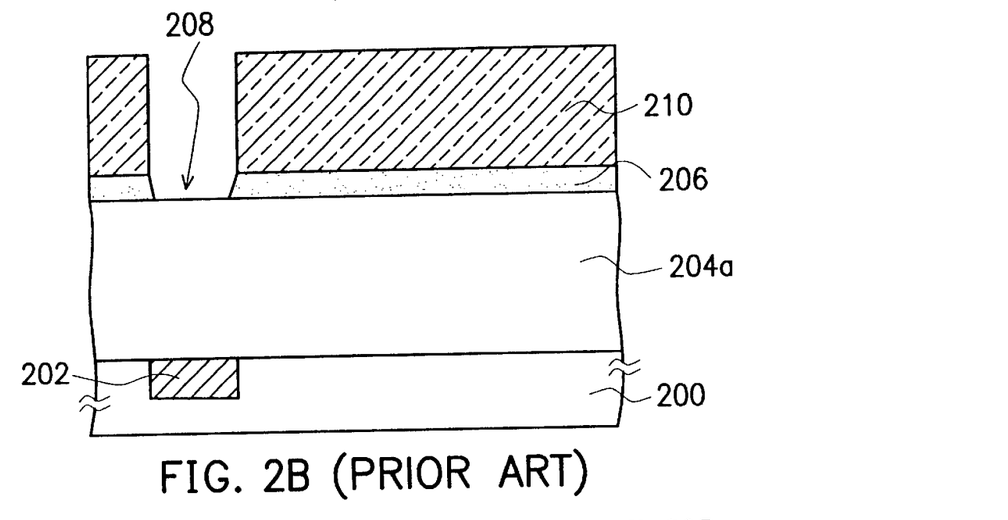

Next, as shown in FIG. 2B, a photoresist layer 210 having an opening is formed over the silicon nitride layer 206. In the subsequent step, using the patterned photoresist layer 210 as an etching mask, the silicon nitride layer 206 is etched to form an opening 208. The opening 208 is formed where a via hole is desired. In other words, the opening 208 is formed directly above the metallic layer 202.

Figure 2C:
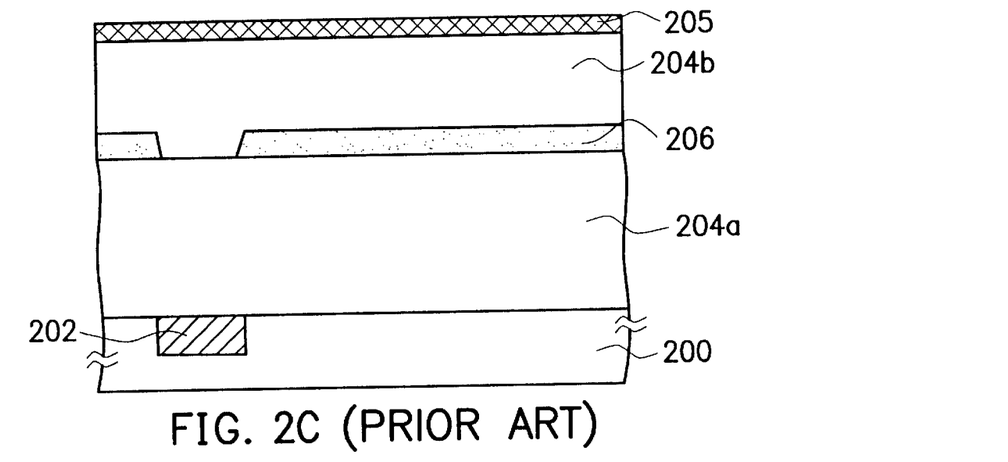

Next, as shown in FIG. 2C, a second dielectric layer 204b and an anti-reflection layer 205 are sequentially formed over the substrate 200. Thickness of the dielectric layer 204b has to be the same as the would-be thickness of the second metallic layer (metallic line) in the dual damascene structure.

Figure 2D:
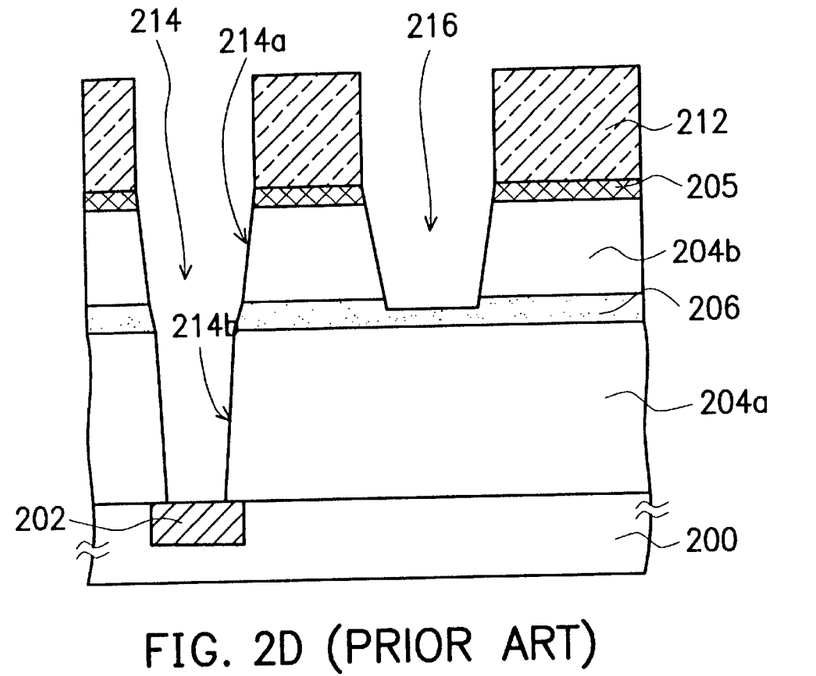

Next, as shown in FIG. 2D, a photoresist layer 212 having an opening is formed over the anti-reflection layer 205. Then, using the patterned photoresist layer 212 as an etching mask, the dielectric layer 204b is etched to form trenches 214a and 216. Thereafter, using the silicon nitride layer 206 as an etching stop layer, the dielectric layer 204a is etched to form an opening 214b that exposes the first metallic layer 202. Hence, the trench 214a and the opening 214b together form the opening 214 of a dual damascene structure.

Figure 2E:
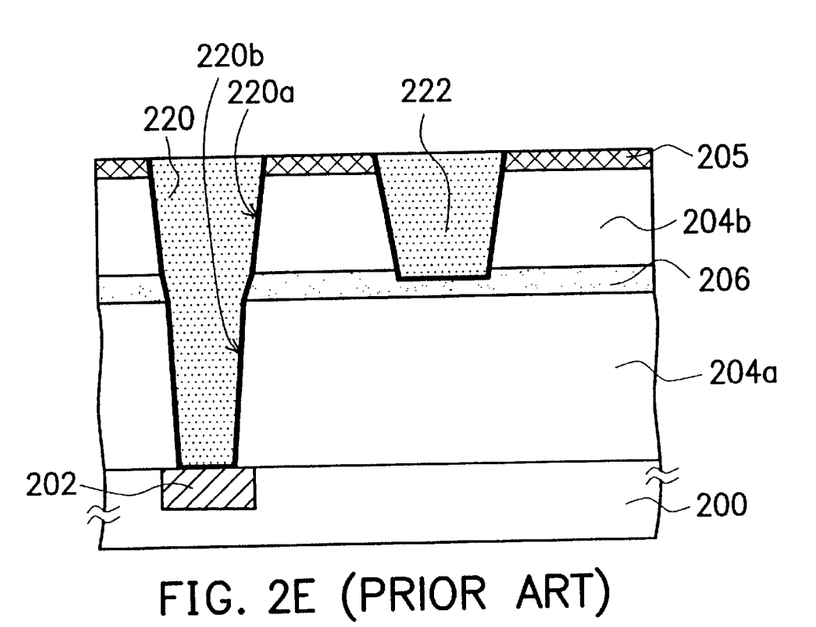

Subsequently, as shown in FIG. 2E, the photoresist layer 212 is removed. Then, a conductive material is deposited over the substrate 100 to fill the opening 214 and the trench 216. Next, the conductive layer is planarized to form a dual damascene structure 220 and a metallic line 222. Conventionally, the conductive material can be aluminum or tungsten with a titanium/titanium nitride composite layer underneath serving as barrier layer/glue layer.

In the alternate method as described in FIG. 2A through 2E, when the dielectric layer 204a is etched to form the opening 214b, an etching stop layer having a lower etching rate than the silicon oxide dielectric layer 204a such as silicon nitride must be used to control the depth of trench 216 after etching. However, silicon nitride has a dielectric constant higher than silicon oxide and can lead to a higher parasitic capacitance. Moreover, a silicon nitride layer can create internal stress large enough to cause cracks and peeling at the interface between the dielectric layer and the silicon nitride layer. In some cases, the use of high temperature in subsequent processing operations may give rise to serious distortion of the substrate 200 that may affect photolithographic processing operations.

Furthermore, the opening 214 of a dual damascene structure has an upper opening 214a and a lower opening 214b, and that the profile of the lower opening 214b is determined by photoresist layer 212 and the etching stop layer 206. Therefore, when the photomask is misaligned, size of the lower opening 214b is reduced. When conductive material is subsequently deposited into the lower opening 214b to form a via plug 220b, contacting area between the via plug 220b and the first metallic layer 202 will be greatly reduced. Consequently, contact resistance between the via plug 220b and the first metallic layer 202 is increased.

Figure 3:
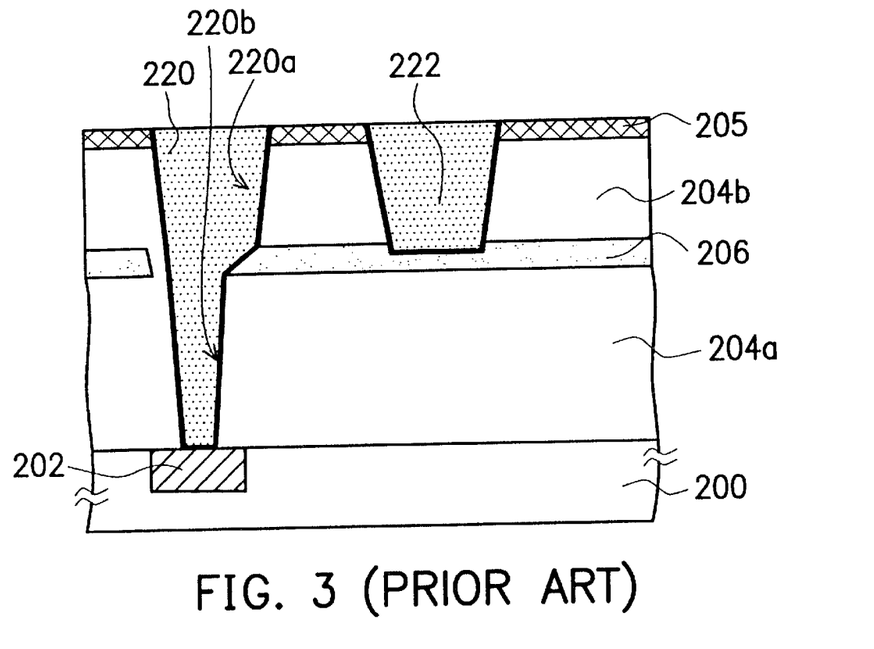
FIG. 3 is a cross-sectional view showing the resulting device when a misaligned photomask is used according to the method described in FIG. 2A through 2E.
Figure 4:
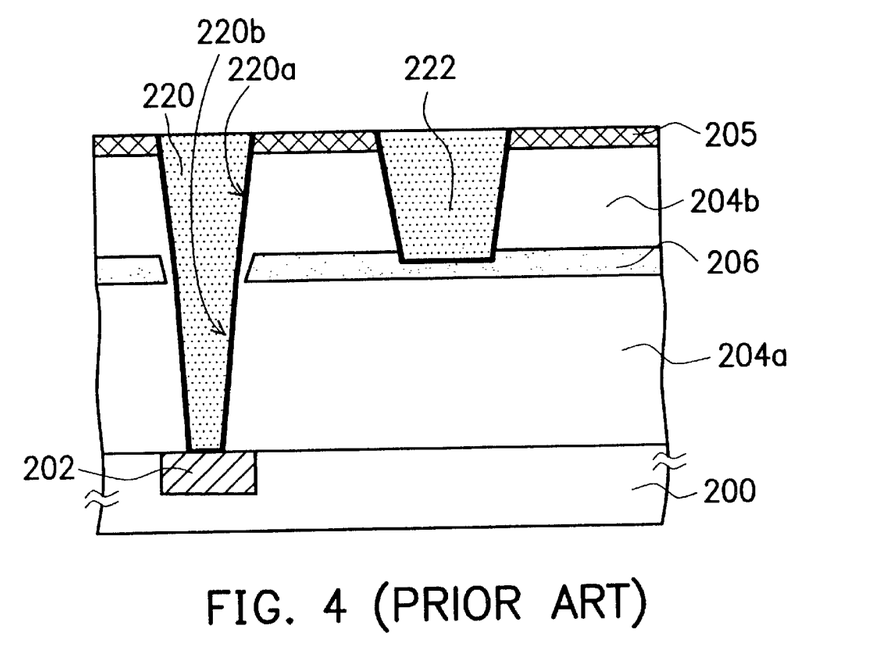
FIG. 4 is a cross-sectional view showing the resulting device when the line width of a metallic line is decreased according to the method described in FIGS. 2A through 2E.

FIG. 3 is a cross-sectional view showing the resulting device when a misaligned photomask is used. In addition, when the depth of a via hole increases, size of the via plug 220b will decrease. Similarly, as the top surface of opening narrows, the width of the metal line 220a will decrease as well. Therefore, as the depth of the via plug 220b is increased or the width of the metal line 220a is decreased, contact area between the via plug 220b and the first metallic layer 202 shrinks. FIG. 4 is a cross-sectional view showing the resulting device when the line width of a metallic line is decreased.

Moreover, in order to lower reflection from the first metallic layer during photolithographic operations, the two aforementioned methods both require extra steps to form the anti-reflection layer. Hence, manufacturing steps are wasted and production cost is increased.

In light of the foregoing, there is a need to provide an improved method of forming dual damascene structure.

SUMMARY OF THE INVENTION

Accordingly, the present invention provides a method of forming dual damascene structure that does not require the formation of a silicon nitride etching stop layer, which has a lower etching rate relative to an oxide dielectric layer. Consequently, problems such as parasitic capacitance and internal stress due to the presence of a silicon nitride layer can be avoided. Moreover, depth of metallic lines and via holes of a dual damascene structure can be controlled more effectively.

Another aspect of this invention is to provide a method of forming dual damascene structure capable of preventing any reduction of contact area between the first metallic layer and the metal plug above resulting from photomask misalignment, narrow metallic lines or deep via holes.

One further aspect of this invention is to provide a method of forming dual damascene structure that does not require an additional step for forming an anti-reflection layer. Hence, manufacturing steps are saved and production cost is reduced.

To achieve these and other advantages and in accordance with the purpose of the invention, as embodied and broadly described herein, the invention provides a method of forming dual damascene structure. The method comprises the steps of providing a substrate having a first conductive layer formed thereon, and then sequentially forming a first dielectric layer, an anti-reflection layer and a second dielectric layer. Next, the first dielectric layer, the anti-reflection layer and the second dielectric layer are patterned to form a first opening that exposes the conductive layer. Thereafter, the second dielectric layer is patterned to form a trench and a second opening in a position above the first conductive layer. The second opening and the first opening together form an opening of the dual damascene structure. Finally, a second conductive material is deposited into the opening and the trench to form conductive lines and the dual damascene structures.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

FIGS. 5A through 5E are cross-sectional views showing the progression of manufacturing steps in fabricating a dual damascene structure according to one preferred embodiment of this invention.

Figure 5A:
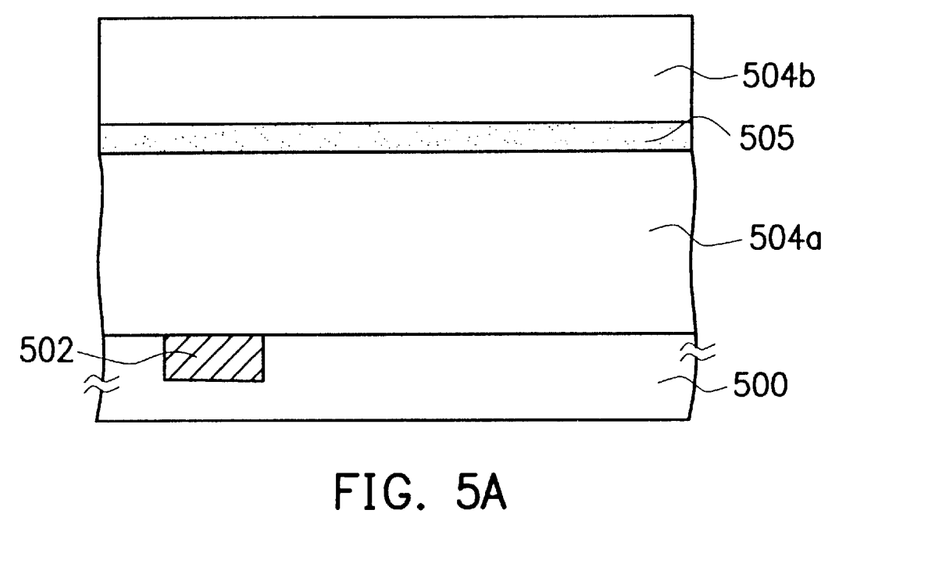
FIGS. 5A through 5E are cross-sectional views showing the progression of manufacturing steps in fabricating a dual damascene structure according to one preferred embodiment of this invention.

First, as shown in FIG. 5A, a substrate 500 having a conductive layer/metallic layer 502 thereon is provided. Next, a dielectric layer 504a is formed over the substrate 500, and then the dielectric layer 504a is planarized. Thereafter, an anti-reflection layer 505 is formed over the dielectric layer 504a. This is followed by the formation of another dielectric layer 504b over the anti-reflection layer 505.

The planarized dielectric layer 504a has a thickness roughly equal to the thickness of via hole in the final dual damascene structure. The dielectric layer 504b, on the other hand, has a thickness roughly equal to the thickness of a conductive line (metallic line) in the final dual damascene structure. Typically, the dielectric layers 504a and 504b are formed by depositing silicon oxide using, for example, a chemical vapor deposition method.

The method of planarizing the dielectric layer 504a includes, for example, a chemical-mechanical polishing method. Material for forming the anti-reflection layer 505 depends on the light source used in a photolithographic operation. For example, when deep ultra-violet (deep UV) light is used as the light source, the preferred material for forming the anti-reflection layer 505 includes silicon oxynitride ($Si_xO_yN_z$).

Figure 5B:
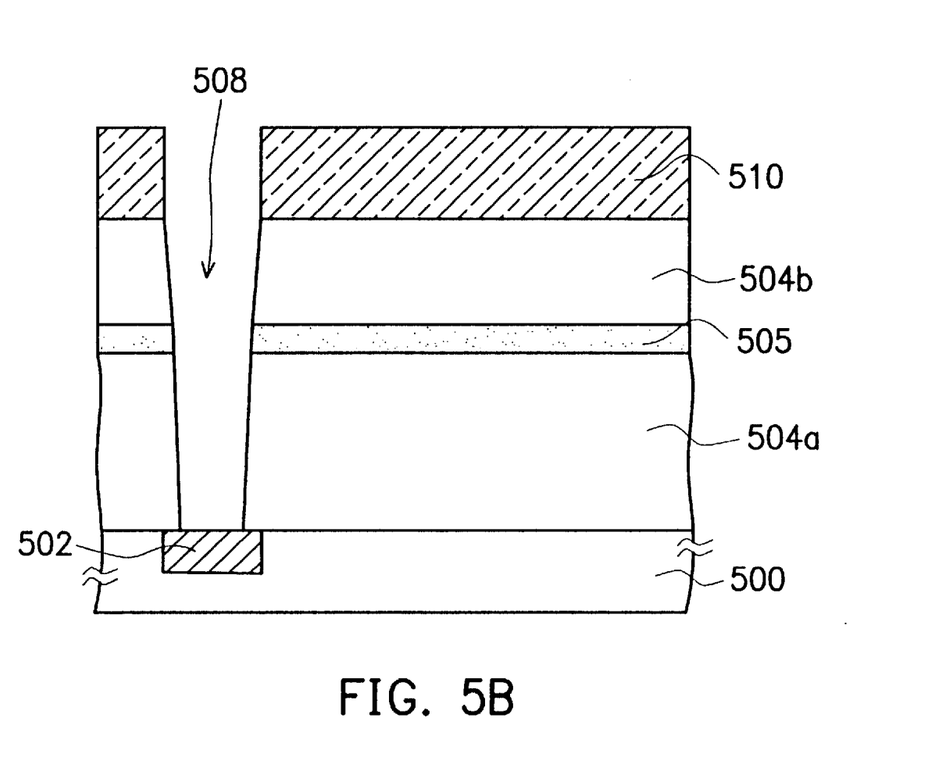

Next, as shown in FIG. 5B, photolithographic and etching techniques are used to pattern the dielectric layer 504b, the anti-reflection layer 505 and the dielectric layer 504a to form an opening 508 that exposes the conductive layer 502. Typically, the patterning method includes depositing photoresist over the dielectric layer 504b, and then patterning the photoresist layer 510 to form an opening. Thereafter, the dielectric layer 504b, the anti-reflection layer 505 and the dielectric layer 504a are sequentially etched to form the opening 508 using the photoresist layer 510 as a mask. Finally, the photoresist layer 510 is removed.

Figure 5C:
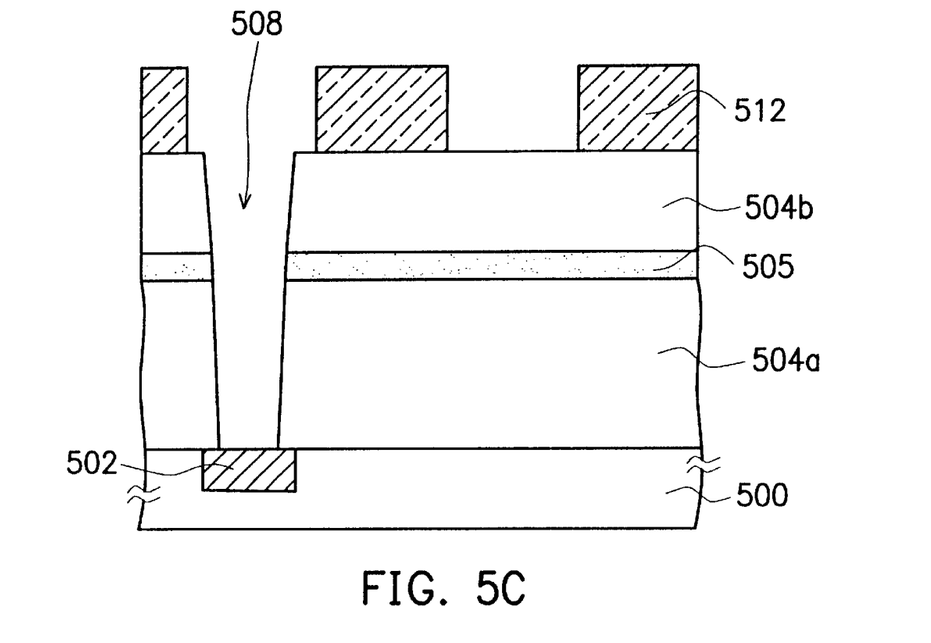
Figure 5D:
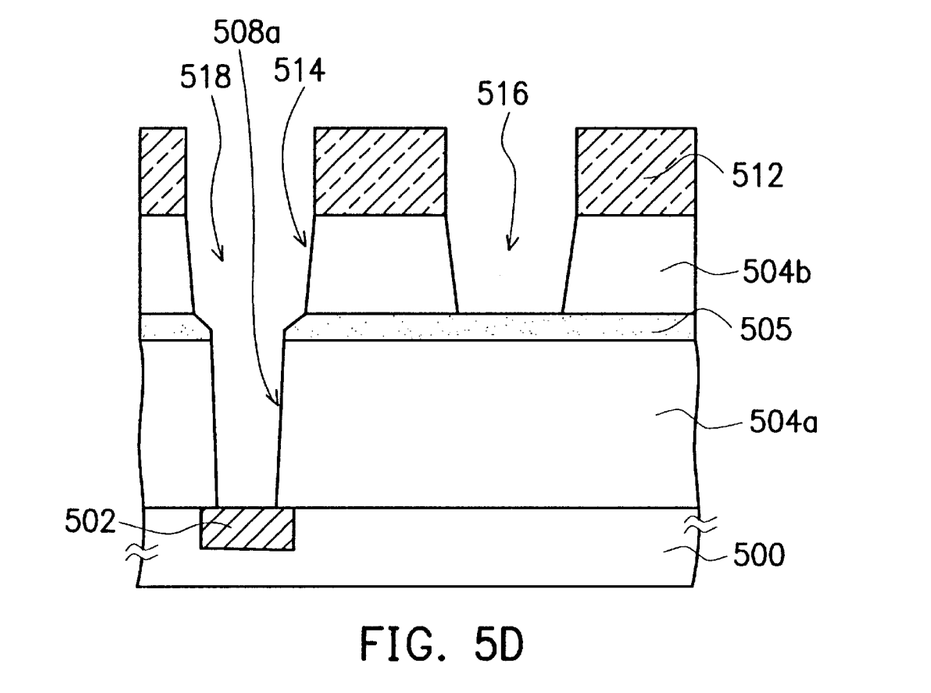

In the subsequent step, as shown in FIGS. 5C and 5D, the dielectric layer 504b is again patterned to remove a portion of the material to form trenches (or opening) 514 and 516. Trench 514 is formed in a position above the conductive layer 502. The trench 514 together with the opening 508a in the dielectric layer 504a form an opening 518 of the dual damascene structure. Typically, the patterning method includes depositing photoresist over the dielectric layer 504b, and then patterning the photoresist layer 512 to form openings. Thereafter, the dielectric layer 504b is etched to form trenches 514 and 516 using the photoresist layer 512 as a mask. Finally, the photoresist layer 512 is removed.

In this invention, the anti-reflection layer 505 has two uses. Firstly, the anti-reflection layer 505 can serve as a coating for lowering light reflection from the conductive layer 502, thereby increasing the resolution of photolithographic processing operations. Higher resolution in photolithography will result in the forming of high-quality opening 508 and trenches 514 and 516. Secondly, the anti-reflection layer 505 can serve as an etching stop layer when the dielectric layer 504b is etched to form the trenches 514 and 516. This is because the dielectric layer 504b and the anti-reflection layer 505 are made from two different types of materials. Consequently, their difference in etching rates can be utilized in the etching process.

Figure 5E:
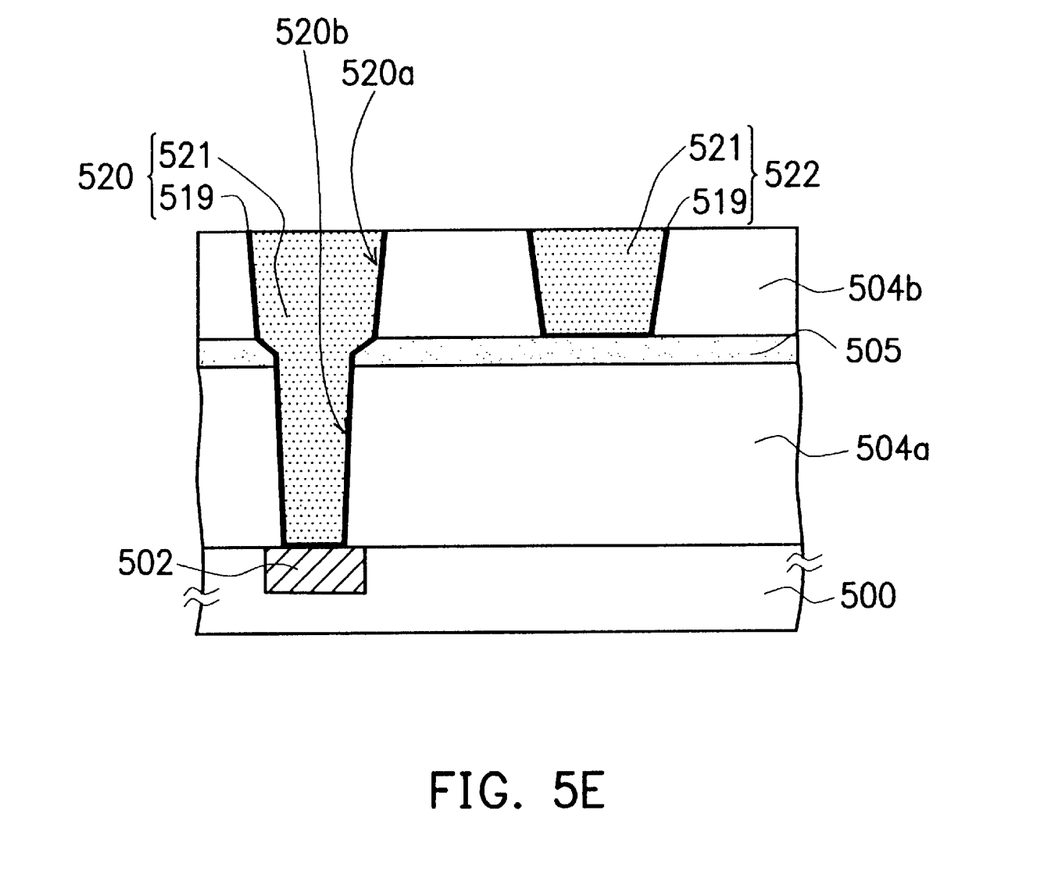

Thereafter, as shown in FIG. 5E, conductive material is deposited over the substrate 500 to fill the opening 518 and the trench 516. Finally, the conductive layer is planarized to form a dual damascene structure 520 and a conductive line 522. The conductive layer can be an aluminum layer, a tungsten layer or a copper layer with an underlying barrier/glue layer, for example, a titanium/titanium nitride composite layer. The method of forming the conductive layer includes forming a conformal barrier/glue layer 519 over the substrate 500 and the interior surfaces of the opening 518 and trench 516. Then, a metallic layer 521 is formed over the substrate 500 and completely fills the opening 518 and the trench 516. Finally, a planarization is carried out to remove the barrier/glue layer 519 and the metallic layer 521 that lie above the dielectric layer 504b. The planarization operation includes using, for example, a chemical-mechanical polishing method.

As mentioned before, size of lower opening 508a for forming the via plug 520b of a dual damascene structure is largely determined by the size of the opening, formed by the first photolithographic operation, in the patterned photoresist layer. In other words, size of the lower opening 508a will be unaffected by the second photolithographic operation for forming trenches 514 and 516. Therefore, even if the via plug 520b is long, the metallic line 520a is narrow, or the mask in the second photolithographic operation is misaligned, contact area between the via plug 520b and the conductive layer 502 will not be reduced.

In summary, major aspects of this invention includes:

1. A silicon nitride etching stop layer with a lower etching rate than a silicon oxide layer is not required. Consequently, parasitic capacitance or internal stress problems caused by the presence of a silicon nitride layer can be avoided. Furthermore, thickness of the metallic lines and depth of via holes in dual damascene structures can be more effectively controlled.

2. Contact area between via plug and the first metallic layer will not be reduced due to a misalignment of photomask in the second photolithographic operation.

3. Contact area between via plug and the first metallic layer will not be reduced due to a narrow metallic line or a long via hole in the dual damascene structure.

4. The anti-reflection layer can minimize reflection when photolithographic operation is performed, and hence is capable of increasing photolithographic resolution. Moreover, difference in material properties between the anti-reflection layer and the dielectric layer can be utilized. Therefore, the anti-reflection layer can act as an etching stop layer when the dielectric layer is etched.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a dual damascene structure, the method comprising the steps of:

providing a substrate having a conductive region formed thereon;

forming a first dielectric layer, an etch-stop layer and a second dielectric layer over the substrate, wherein the etch-stop layer comprises silicon oxynitride;

selectively etching the second dielectric layer, the etch-stop layer and the first dielectric layer until a portion of the conductive region is exposed to form a first opening;

third etching the second dielectric layer to form a second opening and a third opening over the first opening until a portion of the etch-stop layer is exposed within the second opening, wherein the first opening is further enlarged by said third opening so that the first and the third openings together form a dual damascene structure, wherein an etching rate of the second dielectric layer is substantially different than an etching rate of the etch-stop layer to assist in the formation of the first and second openings; and forming a second conductive layer inside the first opening and the second opening of the dual damascene structure.

2. The method according to claim 1, wherein the material of the etch-stop layer is different from the material of the first and the second dielectric layer.

3. The method of claim 1, wherein the dielectric constant of the etch-stop layer is lower compared to a silicon nitride layer.

* * * * *

UNITED STATES PATENT AND TRADEMARK OFFICE
CERTIFICATE OF CORRECTION

PATENT NO. : 6,593,223 B1
DATED : July 15, 2003
INVENTOR(S) : Yimin Huang and Tri-Rung Yew It is certified that error appears in the above-identified patent and that said Letters Patent is hereby corrected as shown below:

<u>Column 6,</u>
Line 49, delete "third"

Signed and Sealed this

Sixth Day of January, 2004

JAMES E. ROGAN
*Director of the United States Patent and Trademark Office*